United States Patent [19]
Heikkilä et al.

[11] Patent Number: 5,805,093
[45] Date of Patent: Sep. 8, 1998

[54] OVERSAMPLED HIGH-ORDER MODULATOR

[75] Inventors: Juha Heikkilä, Oulu; Lauri Lipasti, Helsinki, both of Finland

[73] Assignee: Atmel Corporation, San Jose, Calif.

[21] Appl. No.: 750,246

[22] PCT Filed: Jun. 1, 1995

[86] PCT No.: PCT/FI95/00312

§ 371 Date: Jan. 14, 1997

§ 102(e) Date: Jan. 14, 1997

[87] PCT Pub. No.: WO95/34955

PCT Pub. Date: Dec. 21, 1995

[30] Foreign Application Priority Data

Jun. 7, 1994 [FI] Finland .................... 942679

[51] Int. Cl.[6] ............................................. H03M 3/00
[52] U.S. Cl. ............................................. 341/143; 341/118
[58] Field of Search ................................. 341/143, 118

[56] References Cited

U.S. PATENT DOCUMENTS

| | | | |
|---|---|---|---|
| 5,012,244 | 4/1991 | Wellard et al. . | |
| 5,243,345 | 9/1993 | Naus et al. | 341/143 |
| 5,248,972 | 9/1993 | Karema et al. | 341/143 |
| 5,311,181 | 5/1994 | Ferguson, Jr. et al. | 341/143 |
| 5,311,183 | 5/1994 | Ferguson, Jr. et al. . | |
| 5,376,892 | 12/1994 | Gata | 327/73 |
| 5,623,263 | 4/1997 | Kuo et al. | 341/143 |

FOREIGN PATENT DOCUMENTS

| | | |
|---|---|---|
| 0515154 | 5/1992 | European Pat. Off. . |
| 0494738 | 7/1992 | European Pat. Off. . |
| 0501580 | 9/1992 | European Pat. Off. . |
| 0512687 | 11/1992 | European Pat. Off. . |
| 0565126 | 4/1993 | European Pat. Off. . |

Primary Examiner—Jeffrey A. Gaffin
Assistant Examiner—Jason L. W. Kost
Attorney, Agent, or Firm—McDermott, Will & Emery

[57] ABSTRACT

The invention relates to an oversampled high-order modulator, especially a sigma-delta modulator, comprising cascaded integrators in a number corresponding to the order of the modulator, a quantizer, and a negative feedback. The problem with the high-order modulator is that the modulator is locked in an unstable mode from which it should be restored without considerably interfering with the operation of the modulator. The invention achieves this by temporarily changing the value of the negative feedback to a direction which will restore the stable operation.

16 Claims, 5 Drawing Sheets

OVERSAMPLED HIGH-ORDER MODULATOR

FIELD OF THE INVENTION

The invention relates to an oversampled high-order modulator, especially a sigma-delta modulator.

BACKGROUND OF THE INVENTION

In analog-to-digital converters (A/D) and digital-to-analog converters (D/A) utilizing noise shaping technique based on oversampling and sigma-delta modulation a signal is quantized into one or several bits at an oversampling frequency in a sigma-delta modulator. The resulting quantization noise is shaped in such a way that the proportion of the quantization noise remaining within the frequency band of the actual signal band is as small as possible, and the noise is transferred outside the signal band. The performance of the noise shaping is mainly dependent on the order and oversampling ratio of the noise shaper, i.e. the sigma-delta modulator. A high-order modulator attenuates the quantization noise on the signal band more than a low-order modulator. Thus, a high-order modulator provides a better signal-to-noise ratio on the signal band, but as a result there is accordingly more quantization noise energy outside the signal band. This quantization noise outside the band is easy to remove by filtering, however.

Using high-order modulators would thus be considerably advantageous, since they enhance the signal-to-noise ratio. However, their use is limited by problems in stability.

As is well known, a low-order, i.e. a first-order modulator, is stable irrespective of the level of the input signal, and so is a second-order sigma-delta modulator. There are, however, severe stability problems associated with high-order sigma-delta modulators having an order of three or higher. The stability of the high-order modulators is dependent on the amplitude of an incoming signal. When the modulator assumes an unstable mode of operation, the output voltages/output values of its integrators increase abruptly, and the bit stream from the output of the modulator begins to oscillate independently of the input signal. The high-order modulator does not necessarily return to the linear operation range even though the input signal would return to the stable operation range.

A known arrangement aiming at maintaining the stability of the modulator carefully limits the voltage range of the integrators within the stable operation range. The problem with limiting the voltage range of the integrators is the practical implementation, since additional circuits causing interference should be avoided in the first stage of the modulator, in which the sensitivity of the modulator is at its highest.

U.S. Pat. No. 5,012,244 discloses a stabilization circuit of a high-order sigma-delta modulator, comprising a comparator which resets at least one integrator in the modulator upon detecting that the modulator operates at or near an unstable condition. Finnish Patent 88,765 discloses a similar stabilization circuit, where only the last integrators of the modulator are reset, however, i.e. the order of the modulator is lowered. Such resetting of the integrators is an effective way of restoring the modulator from the unstable mode, but there is also significant interference in the operation of the modulator.

DISCLOSURE OF THE INVENTION

An object of the invention is such a stabilization of the modulator that requires no resetting of the integrators.

The present invention relates to an oversampled high-order modulator, especially a sigma-delta modulator, comprising cascaded integrators in a number corresponding to the order of the modulator, a quantizer, and a negative feedback from the quantized output of the modulator to the input of at least one integrator, a means for detecting the unstable mode of the modulator, and means for restoring the modulator to stable operation, characterized in that the means for restoring the modulator to stable operation comprise means for temporarily changing the value of said feedback to a direction which will restore the stable operation.

The present invention is based on the discovery that a high-order sigma-delta modulator can also be stabilized in such a way that the value of the feedback of the integrators in the sigma-delta modulator are temporarily changed. This procedure is not as effective as the resetting of some or all integrators, but it is sufficient to restore stability. Furthermore, the performance of the sigma-delta modulator, in terms of the signal-to-noise ratio, for example, is the better the less the state of the modulator is changed.

BRIEF DESCRIPTION OF THE DRAWINGS

The invention will be described in greater detail by means of examples and with reference to the accompanying drawings, in which.

PREFERRED EMBODIMENTS OF THE INVENTION

Figure 5:
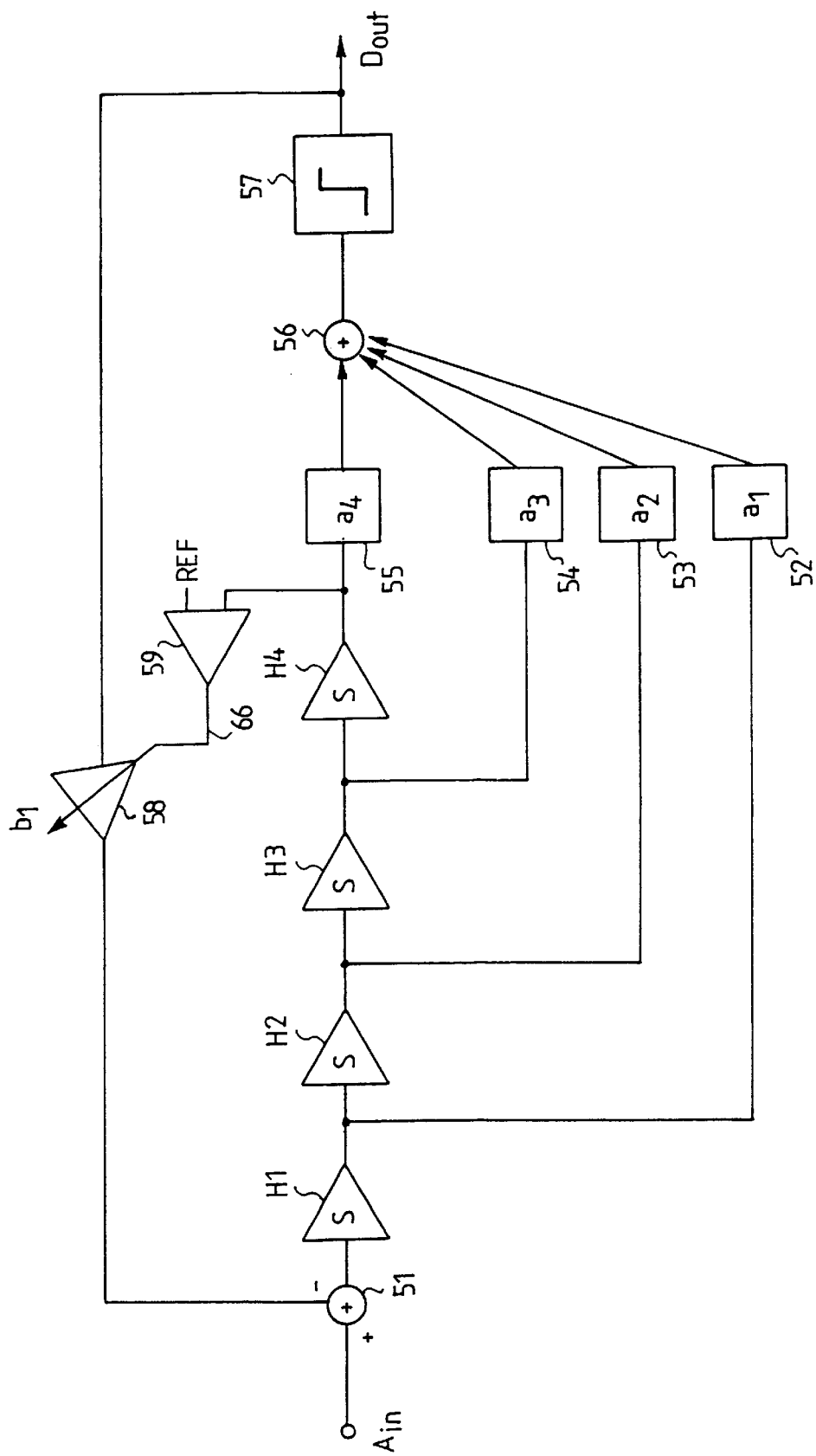
FIG. 5 is a block diagram of a feedforward modulator according to the invention.

Sigma-delta modulators may be implemented by utilizing either a multiple feedback (MF) configuration, as in FIGS. 1 to 4, or a feedforward (FF) configuration, as in FIG. 5. Both an MF and an FF sigma-delta modulator comprises a series connection of n integrator stages H1, H2, H3, ... Hn, where n is a positive integer. The order of the modulator is equal to the number of the integrator stages. A modulator comprising at least three integrator stages (a third-order modulator) is called a high-order modulator. In the MF modulator configurations of FIGS. 1, 3 and 4, a feedback signal, scaled by a feedback coefficient b1, from the output of the modulator is subtracted from an input signal $A_{IN}$ of the modulator in a subtractor means 11 before the signal is supplied to the first integrator stage $H_1$. Similarly, the input of each of the subsequent integrator stages $H_2$, $H_3$ and $H_4$ comprises a respective subtractor means 12, 13 and 14, which subtracts a feedback signal scaled by a respective feedback coefficient b2, b3 and b4 from the output signal of the preceding integrator, and applies the difference to the input of the next integrator stage. The modulator may also comprise scaling means 16, 17, 18 and 19 which scale the signal supplied from the input $A_{IN}$ to a summing means 11, and the signal of the preceding modulator before summing means 12, 13 and 14. The scaling coefficients of the scaling means 16, 17, 18 and 19 may be, for example, a1=a2=a3=a4=1. For the purpose of forming the aforementioned feedback signal, the modulator comprises a switching means 20 which selects one of reference voltages $+V_{ref}$ and $-V_{ref}$ as the feedback signal on the basis of the mode of the digital output signal $D_{OUT}$ of the quantizer 15 (and of the entire modulator). Scaling means 21, 22, 23 and 24 scale the selected feedback signal by the aforementioned feedback coefficients b1, b2, b3 and b4. The coefficients may be for example the following: b1=1, b2=4, b3=16, and b4=64.

Figure 1:
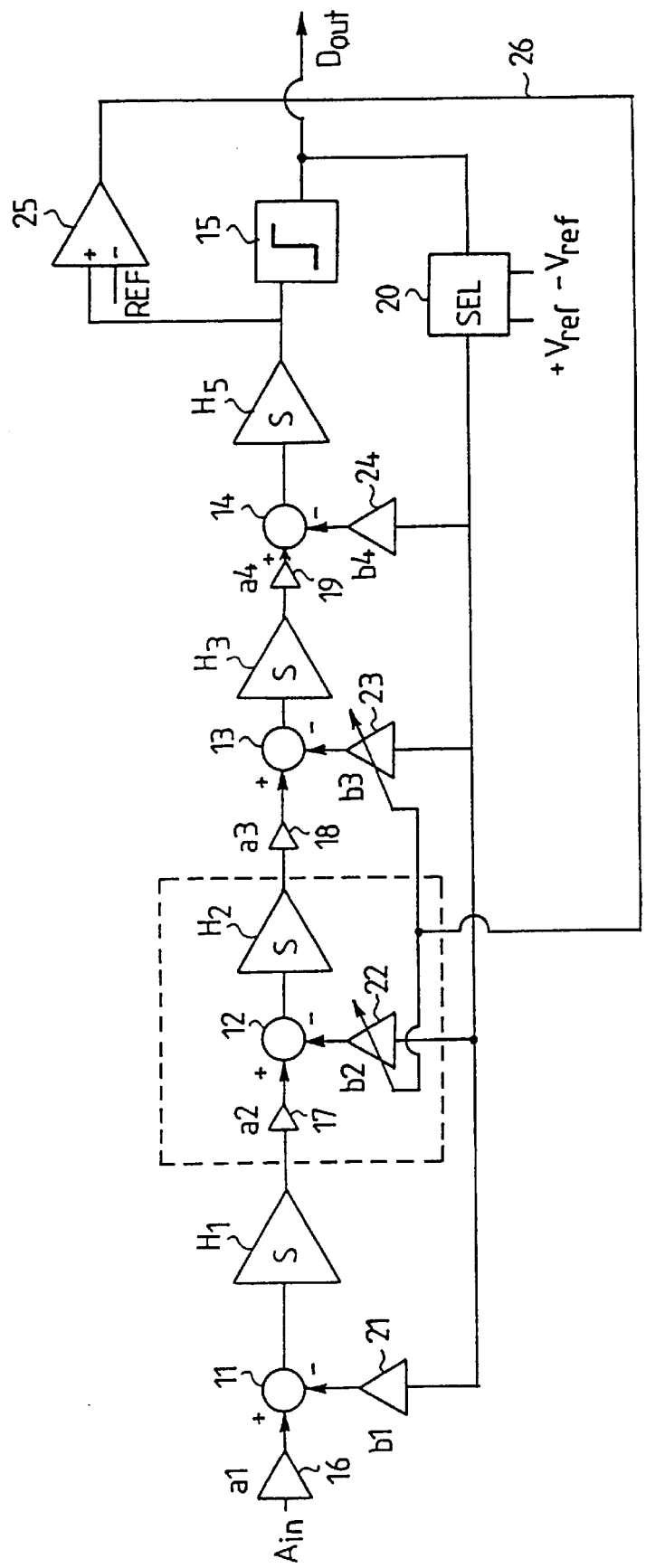
FIG. 1 is a block diagram of a modulator according to the invention.
Figure 2:
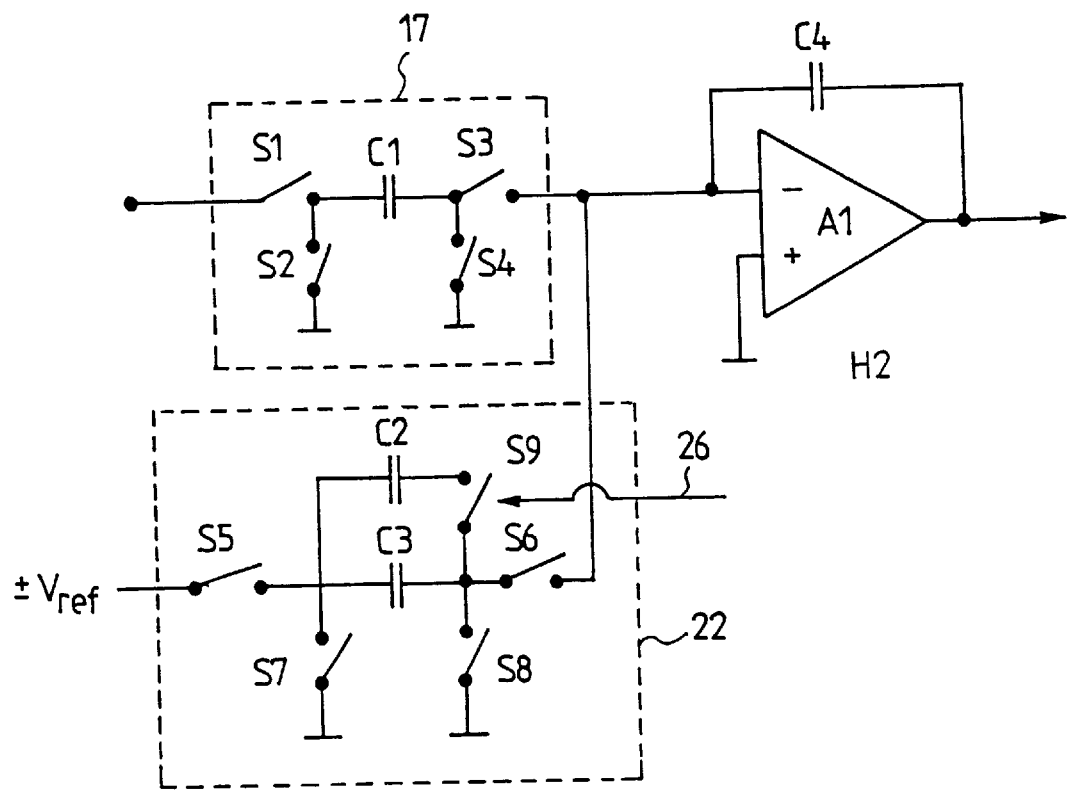
FIG. 2 is a schematic diagram of an embodiment for one integrator stage and its feedback in FIG. 1.
Figure 3:
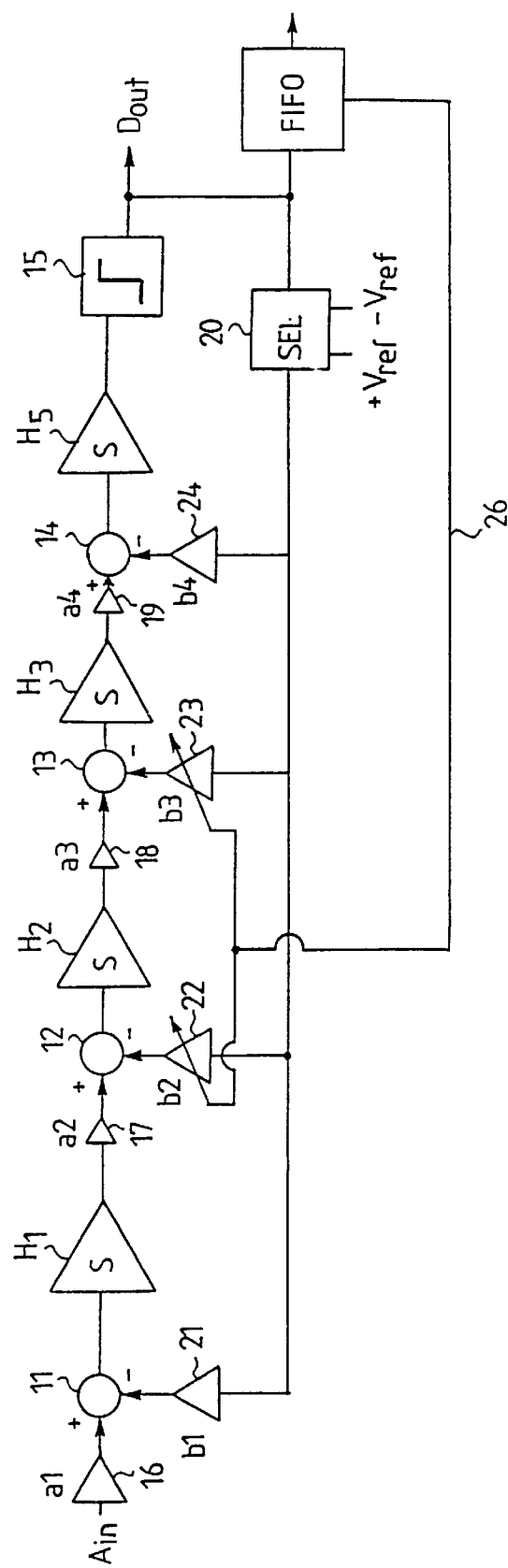
FIG. 3 is a block diagram of another modulator according to the invention.
Figure 4:
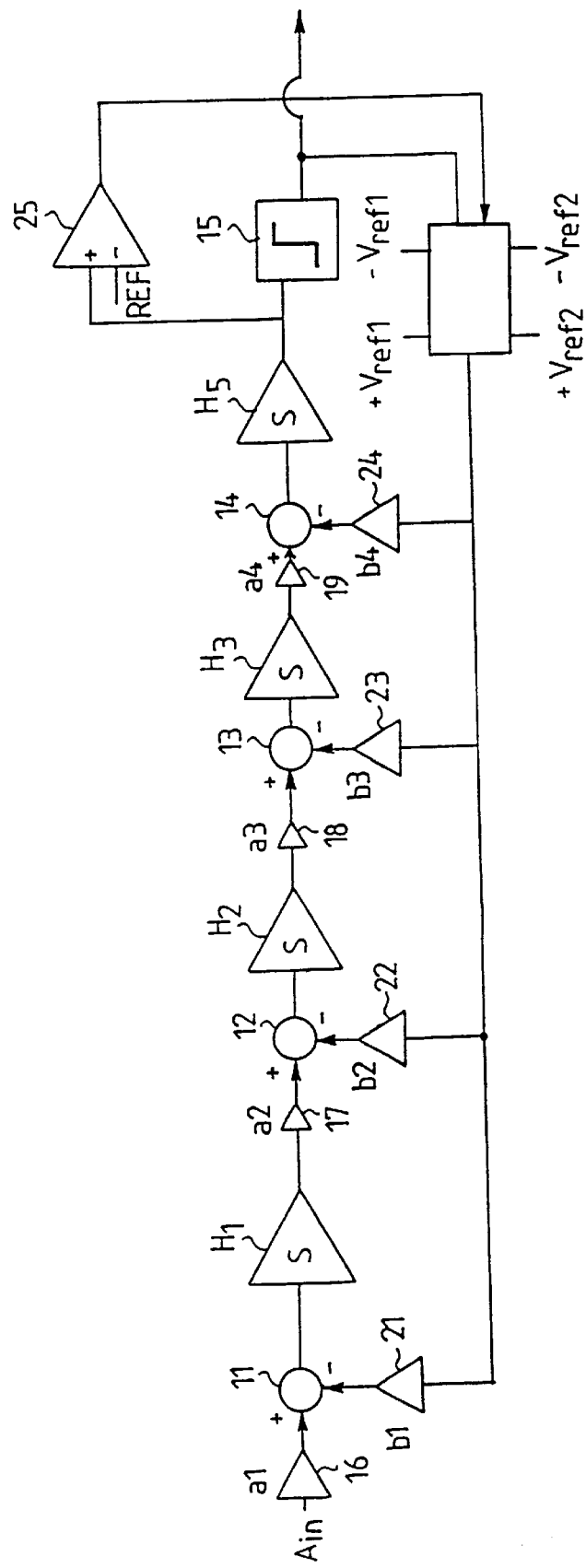
FIG. 4 is a block diagram of a third modulator according to the invention.

According to the invention, such an MF modulator is stabilized by changing the value of the negative feedback of the modulator, when the modulator enters an unstable mode. The value of the feedback may be changed in several different ways, two of which will be discussed in greater detail below: 1) one or several feedback coefficients b1, b2, b3 and b4 are changed, or 2) the reference voltages $+V_{ref}$ and $-V_{ref}$ are changed. FIGS. 1 to 3 illustrate the former case. In FIG. 1, a comparator 25 monitors the output voltage/digital value of the last integrator $H_5$ and compares it to a predetermined threshold value REF. When the threshold value is exceeded, the comparator 25 outputs a control signal 26, which changes the coefficients b2 and b3 of the scaling means 22 and 23. The comparator 25 may also monitor the output of another integrator $H_1$, $H_2$ or $H_3$. The modulator may also comprise several comparators 25 so that the outputs of several integrators can be monitored simultaneously. In A/D converters integrators are analogous, and the comparator 25 is usually also analog then. In D/A converters the integrators are digital, in which case the comparator 25 monitors whether an integrator overflows or whether the digital output word of the integrator exceeds a predetermined digital threshold value.

The unstable mode of the modulator may also be detected by monitoring the digital output data of the modulator, as FIG. 3 illustrates. If the output data of the modulator remains in an unchanged state, i.e. it repeats the same code several times in succession, it can be concluded that the modulator is in an unstable mode. "Several times" means for example twice the order of the modulator, which is already a positive indication in practice. The output of the modulator is a digital code both in an analog and digital modulator. In the embodiment of FIG. 3 this output code of the modulator is applied to a first-in first-out FIFO memory for a sufficient period of time. When the content of the entire FIFO or a certain part of it is filled by one and the same code, the modulator is unstable and the FIFO supplies a control signal 26 to the scaling means 22 and 23. The circuit of FIG. 3 is otherwise identical with the circuit of FIG. 1.

FIG. 2 shows the manner according to a preferred embodiment of the invention for implementing the scaling means 17 and 22, summing means 12 and integrator $H_2$ in the modulator of FIG. 1. The scaling means 18 and 23, summing means 13 and integrator $H_3$ of the subsequent integrator stage are realized in the same way. In FIG. 2, switches S1, S4, S5 and S8 are controlled by the first phase of the oversampling clock (e.g. the front edge), and switches S2, S3, S6 and S7 by the second phase of the clock (e.g. the back edge). In the scaling means 17, the switches S1 and S4 are first closed, whereupon a sample of the output voltage from the previous integrator $H_1$ is supplied to a condensator C1. In the next clock phase, the switches S1 and S4 are opened, and the switches S2 and S3 are closed, whereupon the sample in the condensator C1 is applied to the input of the integrator $H_2$. The value of the condensator C1 determines the scaling coefficient a2.

When the structure and operation of the scaling means 22 is described, it is first assumed that the modulator is in the stable mode and the switch S9 is open. In the first phase of the sampling clock, the switches S5 and S8 are closed, and the switches S7 and S6 are open. The feedback signal $\pm V_{ref}$ then charges the condensator C3. In the second phase of the clock signal, the switches S5 and S8 are opened, and the switches S6 and S7 closed, whereupon the sample stored in the condensator C3 is applied to the input of the integrator $H_2$, where it is added to the sample from the scaling means 17. During normal operation the value of the condensator C3 determines the value of the feedback coefficient b2. When the modulator assumes the unstable mode, the control signal 26 makes the switch S9 close, whereupon the condensator C2 is coupled in parallel with the condensator C3. The total capacitance is then C=C2+C3. The value of the condensator C2 is preferably selected in such a way that the total capacitance C obtained is at least 1.5×C3, whereupon the new feedback coefficient b2' is also a minimum of 1.5×b3. If C2=C3, then b2'=2×b2. In an unstable mode the operation of the scaling means 22 is as described above, except that the sample is charged both to the condensator C2 and C3. When the modulator reverts to the stable mode, the control signal 26 opens the switch S9, whereupon the operation of the scaling means, and thus the coefficient of coupling become normal.

FIG. 5 shows a feed forward modulator configuration. The modulator comprises the integrator stages $H_1$, $H_2$, $H_3$ and $H_4$ connected in series. In a subtractor means 51, a feedback signal from the output of the modulator is subtracted from the input signal $A_{IN}$ of the modulator, and the difference is applied to the first integrator stage. The output of the integrator $H_1$ is applied to the integrator $H_2$, the output of the integrator $H_2$ to the integrator $H_3$, and the output of the integrator $H_3$ to the integrator $H_4$. The outputs of the integrators $H_1$, $H_2$, $H_3$ and $H_4$ are also connected to a summing means 56 through scaling means 52, 53, 54 and 55, respectively. The scaling coefficients of the scaling means 52, 53, 54 and 55 are a1, a2, a3 and a4, respectively. The summing means 56 supplies a sum signal to a quantizer 57, which provides a digital output signal $D_{OUT}$, which is the output signal of the modulator. The signal $D_{OUT}$ is also connected to a scaling means 58, which provides the aforementioned feedback signal by scaling the signal $D_{OUT}$ by coefficient b1. The modulator also comprises a stabilization circuit according to the invention, consisting of a comparator 59 and an adjustable scaling means 58. The comparator 59 compares the output signal of the integrator $H_4$ to a predetermined threshold value. When this threshold value is exceeded, the modulator is concluded to be in an unstable mode, and the comparator 59 supplies a control signal 60, which causes the adjustable scaling means 58 to change the feedback coefficient b1. The adjustable scaling means 58 may be realized in the same way as the scaling means 22 in FIG. 2. The unstable mode of the modulator may also be detected in different ways described in connection with FIGS. 1 to 4.

The figures and the description related thereto are only meant to illustrate the present invention. It must be understood, however, that the above-described solutions may be modified in various ways without departing from the spirit and scope of the invention defined in the appended claims.

We claim:

1. An oversampled high-order modulator, especially a sigma-delta modulator, comprising:

cascaded integrators in a number corresponding to the order of the modulator, a quantizer, and a negative feedback from the quantized output of the modulator to the input of at least one integrator;

a means for detecting the unstable mode of the modulator; and means for restoring the modulator to stable operation, wherein the means for restoring the modulator to stable operation comprises means for temporarily changing a value of said negative feedback to a direction which will restore the stable operation.

2. The modulator according to claim 1, wherein said negative feedback comprises a multiplying means multiplying the feedback signal with a predetermined feedback coefficient prior to summing it to the input of the integrator, and the means for changing a value of the negative feedback comprises means for changing said predetermined feedback coefficient when the modulator is in an unstable mode.

3. The modulator according to claim 2, wherein in the unstable mode of the modulator, the feedback coefficient is at least 1.5 times higher than in the stable mode.

4. The modulator according to claim 1, wherein the means for detecting the unstable mode of the modulator comprises a comparator comparing the output level of at least one integrator to a predetermined threshold value and activates the means restoring the stable operation when said threshold value is exceeded.

5. The modulator according to claim 1, wherein the means for detecting the unstable mode of the modulator comprises a means which monitors the output signal of the modulator and activates the means restoring the stable operation when the output signal remains in an unchanged state.

6. The modulator according to claim 1, wherein said monitoring means is a serial register which may receive a predetermined number of digital codes from the quantized output of the modulator, and the register interprets that the modulator is in an unstable mode when at least a part of the contents of the register is filled by the same code.

7. The modulator according to claim 1, wherein said negative feedback comprises a first and second reference voltage, a selector selecting the reference voltage on the basis of the mode of the modulator's quantized output, and a multiplying means multiplying the selected reference voltage by a predetermined feedback coefficient prior to summing it to the input of the integrator; and the means for temporarily changing a value of the negative feedback comprises means for changing the first and second reference voltage when the modulator is in an unstable mode.

8. The modulator according to claim 1, wherein the modulator is a feedforward or multiple feedback sigma-delta modulator.

9. An oversampled high-order modulator, especially a sigma-delta modulator, comprising:

cascaded integrators in a number corresponding to the order of the modulator, a quantizer, and a negative feedback from the quantized output of the modulator the input of at least one integrator;

a means for detecting the unstable mode of the modulator; and means for restoring the modulator to stable operation, wherein the means for restoring the modulator to stable operation comprises means for temporarily changing a value of said negative feedback to a direction which will restore the stable operation, wherein the means for detecting the unstable mode of the modulator comprises a means which monitors the output signal of the modulator and activates the means restoring the stable operation when the output signal remains in an unchanged state.

10. The modulator according to claim 9, wherein said monitoring means is a serial register which may receive a predetermined number of digital codes from the quantized output of the modulator, and the register interprets that the modulator is in an unstable mode when at least a part of the contents of the register is filled by the same code.

11. The modulator according to claim 9, wherein said negative feedback comprises a first and second reference voltage, a selector selecting the reference voltage on the basis of the mode of the modulator's quantized output, a multiplying means multiplying the selected reference voltage by a predetermined feedback coefficient prior to summing it to the input of the integrator, and said means for temporarily changing a value of the negative feedback includes means for changing the first and second reference voltage when the modulator is in an unstable mode.

12. The modulator according to claim 9, wherein said negative feedback comprises a multiplying means multiplying the feedback signal with a predetermined feedback coefficient prior to summing it to the input of the integrator, and said means for changing a value of the negative feedback includes means for changing said predetermined feedback coefficient when the modulator is in an unstable mode.

13. A sigma-delta A/D converter containing an oversampled high-order sigma-delta modulator, comprising:

cascaded integrators in a number corresponding to the order of the modulator, a quantizer, a negative feedback from the quantized output of the modulator to the input of at least one integrator;

a means for detecting the unstable mode of the modulator; and means for restoring the stable operation of the modulator, wherein the means for restoring the stable mode of the modulator comprises means for temporarily changing a value of said negative feedback to a direction which will restore the stable operation.

14. A sigma-delta D/A converter containing an oversampled high-order sigma-delta modulator, comprising:

cascaded integrators in a number corresponding to the order of the modulator, a quantizer, a negative feedback from the quantized output of the modulator to the input of at least one integrator;

a means for detecting the unstable mode of the modulator; and means for restoring the stable operation of the modulator, wherein the means for restoring the stable operation of the modulator comprises means for temporarily changing a value of said negative feedback to a direction which will restore the stable operation.

15. A sigma-delta A/D converter containing an oversampled high-order sigma-delta modulator, comprising:

cascaded integrators in a number corresponding to the order of the modulator, a quantizer, a negative feedback from the quantized output of the modulator to the input of at least one integrator;

a means for detecting the unstable mode of the modulator; and means for restoring the stable operation of the modulator, wherein the means for restoring the stable mode of the modulator comprises means for temporarily changing a value of said negative feedback to a direction which will restore the stable operation, and the means for detecting the unstable mode of the modulator comprises a means which monitors the output signal of the modulator and activates the means restoring the stable operation when the output signal remains in an unchanged state.

16. A sigma-delta D/A converter containing an oversampled high-order sigma-delta modulator, comprising:

cascaded integrators in a number corresponding to the order of the modulator, a quantizer, a negative feedback from the quantized output of the modulator to the input of at least one integrator;

a means for detecting the unstable mode of the modulator; and means for restoring the stable operation of the modulator, wherein the means for restoring the stable operation of the modulator comprises means for temporarily changing a value of said negative feedback to a direction which will restore the stable operation, and the means for detecting the unstable mode of the modulator comprises a means which monitors the output signal of the modulator and activates the means restoring the stable operation when the output signal remains in an unchanged state.

* * * * *